United States Patent
Shih et al.

(10) Patent No.: US 6,323,118 B1
(45) Date of Patent: Nov. 27, 2001

(54) BORDERLESS DUAL DAMASCENE CONTACT

(75) Inventors: Cheng-Yeh Shih, Hsin-Chu; Yu-Hua Lee, Hsinchu; James (Cheng-Ming) Wu, KaoHsiung, all of (TW)

(73) Assignee: Taiwan Semiconductor for Manufacturing Company, Hsin-chu (TW)

(*) Notice: Subject to any disclaimer, the term of this patent is extended or adjusted under 35 U.S.C. 154(b) by 0 days.

(21) Appl. No.: 09/114,129

(22) Filed: Jul. 13, 1998

(51) Int. Cl.$^7$ .............................. H01L 21/4763
(52) U.S. Cl. .................. 438/624; 438/638; 438/666
(58) Field of Search .................. 438/637, 638, 438/666, 624, 620

(56) References Cited

U.S. PATENT DOCUMENTS

| | | | |
|---|---|---|---|
| 4,832,789 | * 5/1989 | Cochran et al. | 156/644 |
| 4,960,732 | * 10/1990 | Dixit et al. | 438/628 |
| 5,034,347 | * 7/1991 | Kakihana | 438/667 |
| 5,422,309 | 6/1995 | Zettler et al. | 437/192 |
| 5,529,953 | 6/1996 | Shoda | 437/189 |
| 5,565,384 | 10/1996 | Havemann | 437/231 |
| 5,801,094 | * 9/1998 | Yew et al. | 438/624 |
| 5,882,996 | * 3/1999 | Dai | 438/597 |
| 5,891,799 | * 4/1999 | Tsui | 438/624 |
| 5,926,732 | * 7/1999 | Matsuura | 438/622 |
| 5,966,632 | * 10/1999 | Chen et al. | 438/652 |
| 5,976,968 | * 11/1999 | Dai | 438/622 |
| 5,990,015 | * 11/1999 | Lin et al. | 438/706 |
| 6,057,277 | * 5/2000 | Harvey | 438/626 |
| 6,077,769 | * 6/2000 | Huang et al. | 438/622 |
| 6,080,661 | * 6/2000 | Bothra | 438/637 |
| 6,140,226 | * 10/2000 | Grill et al. | 438/637 |

OTHER PUBLICATIONS

Chang et al. "ULSI Technology" The McGraw–Hill Companies, Inc. 1996, p446–447.

* cited by examiner

Primary Examiner—Olik Chaudhuri
Assistant Examiner—Kurt Eaton
(74) Attorney, Agent, or Firm—George O. Saile; Stephen B. Ackerman; Sergin Oktay

(57) ABSTRACT

A method is disclosed for forming self-aligned, borderless contact and vias together and simultaneously with relaxed photolithographic alignment tolerances using a modified dual damascene process having two etch-stop layers. A first etch-stop layer is formed over a first dielectric layer. A second dielectric layer and a second etch-stop layer are next formed sequentially over the first etch-stop layer. Contact/via hole pattern is etched into the first etch-stop layer using a first photoresist layer. A second photoresist layer, patterned with metal line trench pattern, is formed over the contact/via patterned first etch-stop layer. The contact/via hole openings are etched into the first dielectric layer until the second etch-stop layer is reached. Then, both the first and second etch-stop layers are etched through the openings. The openings in the first and second etch-stop layers are both extended by etching the second and first dielectric layers, respectively, until the former opening reaches the second etch-stop layer, and the latter reaches the underlying substructure of devices within the semiconductor substrate. Thus, a combination of contact via interconnects, without borders, and self-aligned with respect to metal lines with relaxed photolithographic tolerances is formed together and simultaneously using a modified dual damascene process having two etch-stop layers.

23 Claims, 3 Drawing Sheets

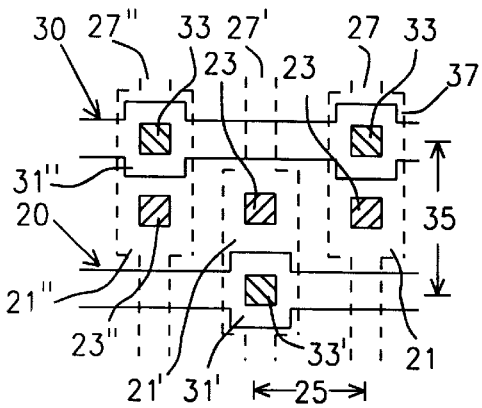
FIG. 1a – Prior Art
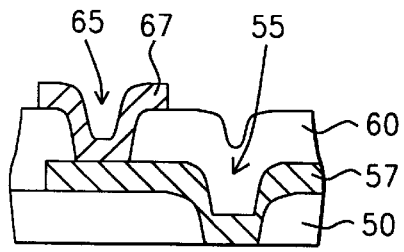
FIG. 1b – Prior Art
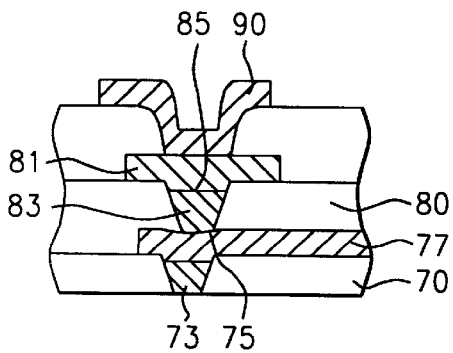
FIG. 1c – Prior Art
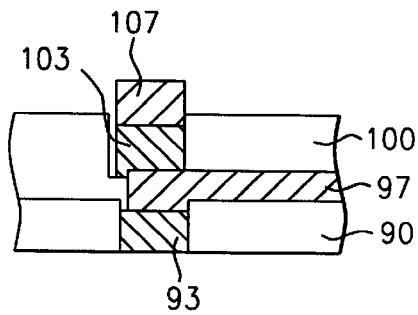
FIG. 2a
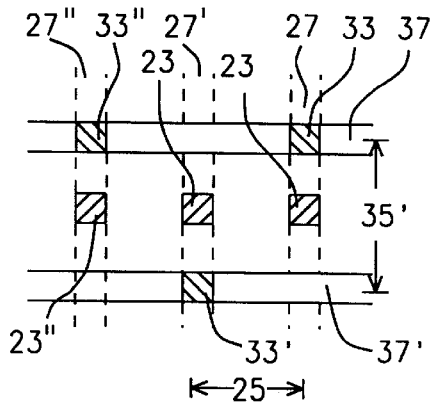
FIG. 2b
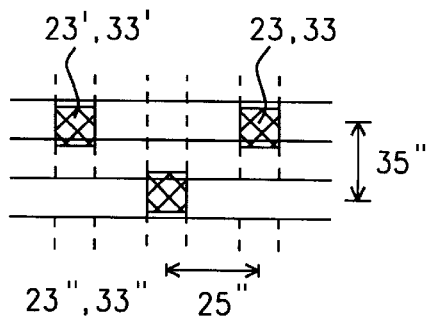
FIG. 2c

BORDERLESS DUAL DAMASCENE CONTACT

BACKGROUND OF THE INVENTION (1) Field of the Invention

The present invention relates to the manufacture of ultra large scale integrated (ULSI) circuit chips in general, and in particular, to forming interconnects in a semiconductor substrate by using a borderless dual damascene process having multiple etch-stop layers.

(2) Description of the Related Art

The advantages of borderless contacts or vias are well known in the art. Borders determine to a large extent how closely metal interconnects can be formed in integrated circuits without encroaching on each other. The amount of encroachment or overlap is mitigated by how well lithographic alignment can be achieved between complex structures of metal line and contact interconnects on and in different levels of a semiconductor substrate in which the integrated circuits are formed. The importance of level-to-level alignment gains even more significance as the very large and ultra large scale integration (VLSI and ULSI) of circuits progresses to even smaller feature sizes of less than a micrometer. The present invention discloses a method of forming self-aligned interconnects where borders are no longer needed and hence the packing density of interconnects, that is, that of the integrated circuits can be increased significantly. The disclosed method takes advantage of an improved dual damascene process. The method is equally applicable to either a metal plug formed through a contact hole over a device in a substrate, or through a via hole connecting two metal layers at different levels in a substrate. It will be known to those skilled in the art that contacts refer to an interconnect which interconnects a source-drain device region, salicide of polysilicon to metal, while vias refer to an interconnect which connects metal to metal.

The effect on packing density of borders around contacts is well illustrated by S. M. Sze, et al., in an article published in ULSI Technology. FIGS. 1a, 2c in the drawings, adapted from Sze, show a gain of more than 62% in the packing area in going from a contact having borders to no borders. FIG. 1a shows fully bordered, staggered vias (23) and (33) formed between metal layers (20) and (30. Metal layers have been patterned to form metal lines (27) at the lower level and metal lines (37) on the upper level. Single and double primed reference numerals (27) and (37) refer to other metal lines at the respective levels (20) and (30), respectively. Via (33) on the upper level has border (31) and via (23) on the lower level has its border (21). Ideally, the pitch between metal lines such as (35) for the upper metal lines and (25) for the lower metal lines, is determined by the minimum line and space dimensions that can be patterned using the most recent advances in lithographic techniques. In practice, line pitch is also limited by the via size and the underlying metal pad size forming the border around the via, such as (31) and (21). It will be known by those skilled in the art that a border around a via is needed, for otherwise, grooves would be etched into the underlying insulating layer during the via-etch step, thus causing a thinning of the next level of metal deposited over the via. The minimum dimension by which the metal pad must frame the via, that is, form a border, is dependent on the misalignment tolerances of the lithography step.

Furthermore, the slope of the via wall must be taken into account when determining the minimum pitch between vias. Sloped walls are needed so that the vias can be filled more easily with metal, and without any voids inside the via holes. Also, appropriate slope is needed for adequate metal coverage over the step of the edge of the via hole when physical vapor deposition is employed. The step coverage is in turn dependent upon the aspect ratio, that is, depth over the width of the via hole. A cross-sectional view of vias (55) and (65) with sloped walls (57) and (67), respectively, is shown in FIG. 1b. It will be noted that the more is the slope of the via wall, the larger the border must be for the metal pad over the lower via to insure full coverage of the via.

It is also noted that the vias of FIG. 1a and FIG. 1b are formed laterally with respect to each other. That is, they are staggered rather than being stacked on top of one another as shown in FIG. 1c. The pitch between staggered vias can be reduced if the borders around the vias can also be reduced. The borders can be reduced if the slope of the walls can be reduced. The slope can be reduced if the holes can be filled properly with walls approaching vertical orientation. As is known in the art, forming metal plugs, such as tungsten plugs, in via holes separate from forming metal lines makes vertical vias possible. Plug forming methods are advantageous also in filling contact or via holes of different cross-sectional areas, though they may not fill the openings up to the top. This is shown by reference numerals (75) and (85) in FIG. 1c where vias (73) and (83) have more steeply sloped walls, and they span, respectively, insulation layers (70) and (80).

Contacts and vias with vertical walls, and with no borders, can also be made, as disclosed later in this invention and as depicted in FIG. 2a. Though the interconnects in FIGS. 2a–2b pertain to vias between metal layers in a substrate, it will be obvious to those skilled in the art that the same approach will apply to contact interconnects that are formed to make connections with the devices formed in the semiconductor substrate.

Thus, vertical vias and/or contacts (93) and (103) are formed in insulating layers (90) and (100), respectively. In the case of vias, shown in FIG. 2b, they connect two metal layers (97) and (107). Thus, the minimum distance, such as (25') and (35') in FIG. 2b, between adjacent metal lines, is reduced since the vias have no slope. Secondly, the borders are no longer needed, since plugs (23), (33) in the completely filled vias provide ample overetch protection to underlying metal structures without mask coverage, as it will be appreciated by those skilled in the art. Even with borderless contacts and vias only, then, there is substantial reduction in the area occupied by these vias as shown in FIG. 2b in comparison with vias with borders of FIG. 1a. Hence, the pitch (35') between adjacent lines (37) and (37') can be reduced. The line pitch can be further reduced if the vias are stacked on top of one another as shown in FIG. 2c where upper vias (23), (23') and (23") are stacked on top of lower vias (33), (33') and (33"), thus significantly reducing upper metal line pitch from (35) to (35"), and lower metal line pitch from (25) to (25"). Hence, significant gains in packing density can be achieved with stacked and borderless contacts or vias.

However, the practice of stacking contacts and borderless contacts is still in its infancy, as observed by Sze in the earlier Reference. Conventionally, the metal layers and the interconnecting layers are formed separately, and serially. First, a first blanket metal is deposited on a first insulating layer and electrical lines are formed by subtractive etching of the metal through a first mask. A second insulating layer is formed over the first metallized layer, and the second insulating layer is patterned with contact or via holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new metal lines, and the process is repeated as many times as it is needed to fabricate a semiconductor substrate. With this conventional process, lithographic alignment tolerances must be held very tight in order to form reliable borderless contacts or vias.

On the other hand, forming plugs and metal lines simultaneously, as in the modified dual damascene process disclosed in this invention, some of the misalignment problems can be overcome. In the standard dual damascene process the insulating layer is coated with a resist material which is exposed to a first mask with the image pattern of the via opening and the pattern is anisotropically etched in the upper half of the insulating layer. After removal of the patterned resist material, the insulating layer is coated with another resist material which is exposed to a second mask with image pattern of the conductive lines in alignment with the via openings. In anisotropically etching the openings for the conductive line in the upper half of the insulating material, the via openings already present in the upper half are simultaneously etched in the lower half of the insulating material. After the etching is complete, both the vias and grooves are filled with metal. Though the alignment of contact or via holes with respect to the metal lines is improved, the standard dual damascene is still difficult to practice in forming borderless contacts and vias for metal pitches of sub-half micron, and with copper metal.

Shoda in U.S. Pat. No. 5,529,953 uses a dual damascene process with selective deposition in forming interconnects in a multi-layered semiconductor device. His method teaches forming a line trench including a first opening portion and a second opening portion in a dielectric layer, forming a first adhesion layer on a surface exposed by the first opening portion, forming a second adhesion layer on a surface exposed by the second opening portion, and selectively depositing a conductive material on the first adhesion layer and the second adhesion layer, wherein growth of the conductive material on the second adhesion layer starts after growth of the conductive material on the first adhesion layer has stared. The first and second adhesion layers are of different materials. Zettler, et al., (U.S. Pat. No. 5,422,309) teach the forming of a metallization level having contacts and interconnects connecting the contacts. Here, an insulating layer wherein contact holes to regions to be contacted are opened is applied surface-wide onto a substrate. For producing an interconnect mask, a photoresist layer is applied, exposed and developed such that the surface of the regions to be contacted remains covered with photoresist in exposed regions, whereas the surface of the insulating layer is uncovered in the exposed regions. Using the interconnect mask as etching mask, trenches are etched into the insulating layer. Contacts and interconnects of a metallization level are finished by filling the contact holes and the trenches with metal. Havemann in U.S. Pat. No. 5,565,384 uses a low permittivity dielectric in forming self-aligned vias. These prior art methods differ from the present invention where two etch-stop layers are used to form borderless contact and via interconnects with a modified and improved dual damascene process.

SUMMARY OF THE INVENTION

It is therefore an object of the present invention to provide method of forming self-aligned and borderless contacts using a dual damascene interconnect process having two etch-stop layers.

It is also an object of the present invention to provide method of forming self-aligned and borderless vias using a dual damascene interconnect process having two etch-stop layers.

It is another object of this invention to provide a method of forming self-aligned, borderless contact and vias together and simultaneously with relaxed photolithographic alignment tolerances using a modified dual damascene process having two etch-stop layers.

These objects are accomplished by providing a semiconductor substrate having a substructure further comprising a semiconductor device within said substrate and an interconnect metal line formed on said substrate; forming a first dielectric layer over said substrate; forming a first etch-stop layer over said first dielectric layer; forming a second dielectric layer over said first etch-stop layer; forming a second etch-stop layer over said second dielectric layer; forming a first photoresist layer over said second etch-stop layer; patterning said first photoresist layer with contact and via (contact/via) hole pattern; etching through said contact/via hole pattern in said first photoresist layer and forming contact/via hole opening in said second etch-stop layer wherein said contact hole pattern is disposed over said device in said substructure and said via hole pattern is disposed over said metal line in said substrate; removing said first photoresist layer from said substrate; forming a second photoresist layer over said substrate including said contact/via hole opening; patterning said second photoresist layer with a metal line trench pattern; etching through said line trench pattern in said second photoresist layer into underlying said substrate until an etch-stop layer, including first and second etch-stop layers, is reached; etching said line trench pattern into said first and second etch-stop layers forming said line trench openings into said first and second etch-stop layers; etching further said line trench pattern into underlying substrate including first and second dielectric layers until reaching said substructure having said devices and/or said metal lines; removing said second photoresist layer; forming metal in said contact/via opening in said first and second dielectric layers; and removing excess of said metal from the surface of said substrate in preparation for subsequent process steps to complete the fabrication of a semiconductor substrate.

BRIEF DESCRIPTION OF THE DRAWINGS

FIG. 1a shows a layout of two levels of metal lines on a semiconductor substrate and interconnected by means of staggered vias having sloped walls and borders, as practiced in prior art.

FIG. 1b shows a staggered vias having sloped walls of prior art.

FIG. 1c shows stacked vias with borders of prior art.

FIG. 2a shows borderless, vertical stacked vias of this invention.

FIG. 2b shows a layout of two levels of metal lines interconnected through staggered and borderless vias of this invention.

FIG. 2c shows a layout of two levels of metal lines interconnected through stacked and borderless vias of this invention.

DESCRIPTION OF THE PREFERRED EMBODIMENTS

Figure 3A:
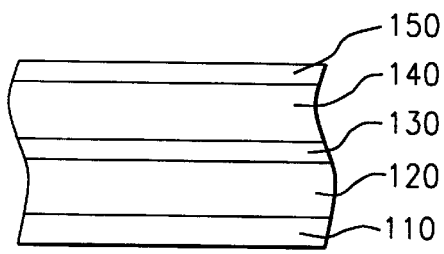
FIG. 3a shows a semiconductor substrate with two dielectric layers and two etch-stop layers formed alternatingly thereon, according to this invention.
Figure 3E:
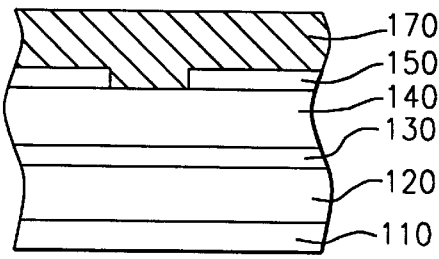
FIG. 3e shows the forming of a second photoresist layer on the substrate of FIG. 3d of this invention.
Figure 3B:
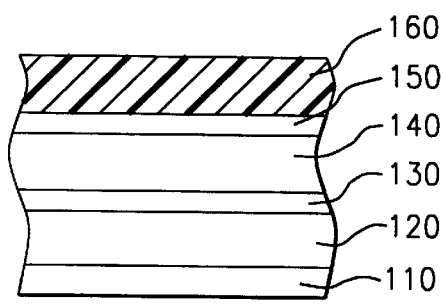
FIG. 3b shows the forming of a first photoresist layer on the substrate of FIG. 3a, according to this invention.
Figure 3F:
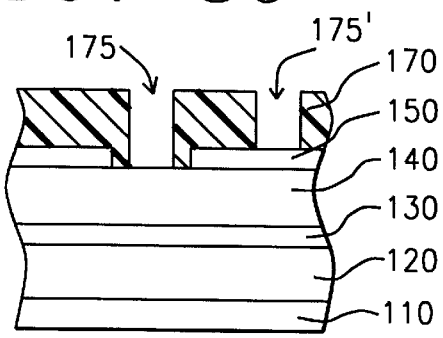
FIG. 3f shows the patterning of the second photoresist layer of this invention.
Figure 3C:
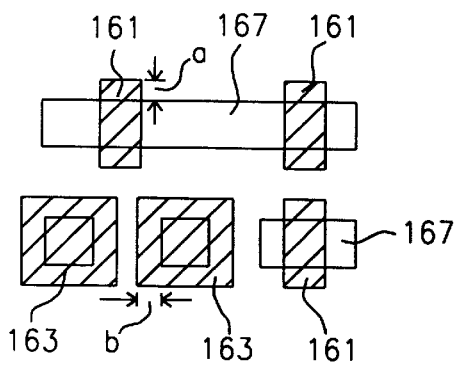
FIG. 3c shows a top view of the patterned first photoresist layer, according to this invention.
Figure 3G:
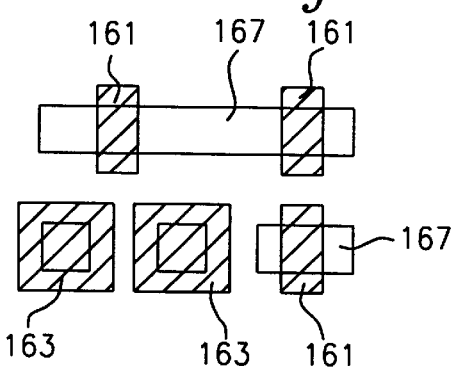
FIG. 3g shows a top view of the patterned second photoresist layer, according to this invention.
Figure 3D:
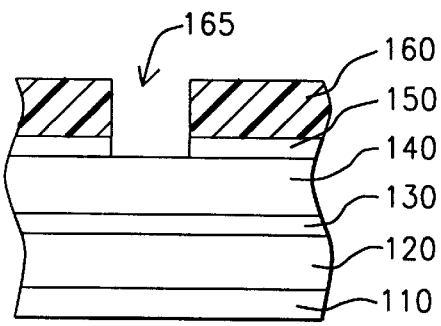
FIG. 3d shows the etching of the first pattern (contact hole) into the second etch-stop layer of this invention.
Figure 3H:
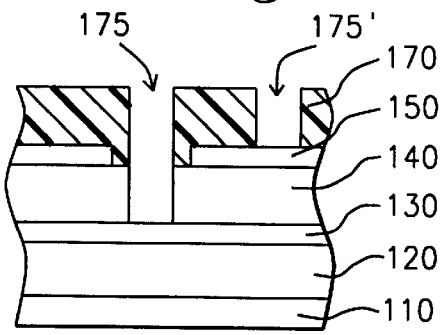
FIG. 3h shows the etching of the second pattern (via hole) into the second dielectric layer, according to this invention.
Figure 3I:
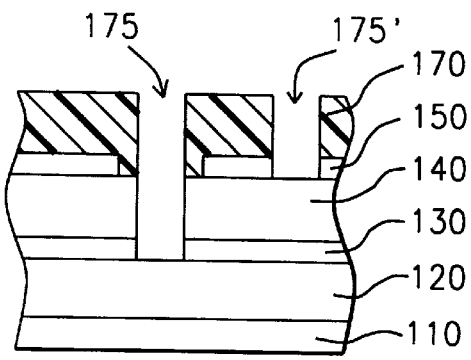
FIG. 3i shows the etching of the second pattern into the first and second etch-stop layers of this invention.
Figure 3M:
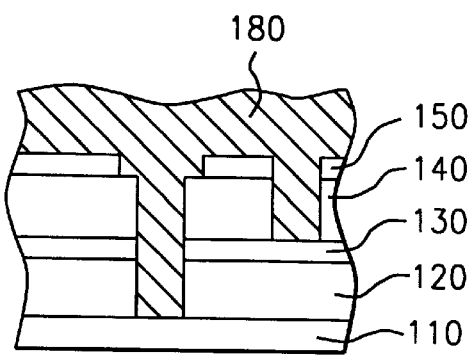
FIG. 3m shows the metallization of the dual damascene contact/via structure of this invention.
Figure 3J:
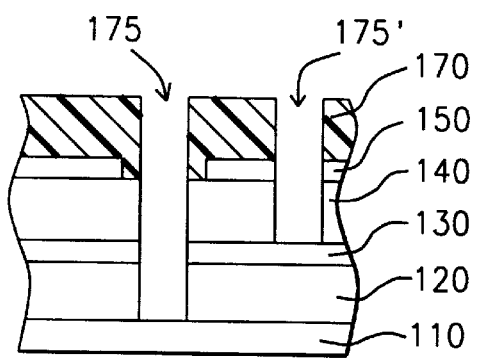
FIG. 3j shows the etching of the second pattern into the second and first dielectric layers, according to this invention.
Figure 3N:
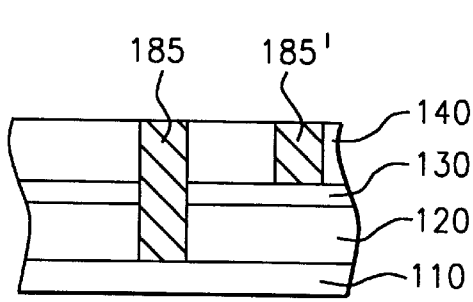
FIG. 3n shows the chemical mechanical polishing of the substrate of FIG. 3m of this invention to form the contact/via interconnect of this invention.
Figure 3K:
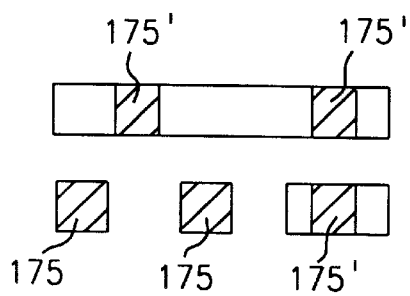
FIG. 3k shows a top view of the borderless contact and vias of this invention.
Figure 3P:
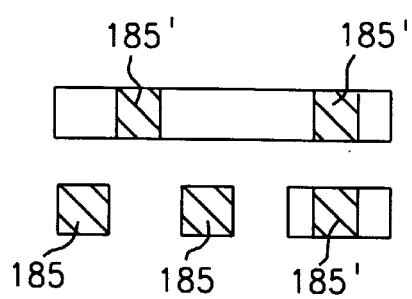
FIG. 3p shows a top view of self-aligned, borderless contact and via interconnects of this invention formed with a modified dual damascene process having two etch-stop layers, according to this invention.

Referring now the drawings, in particular to FIGS. 3a–3p, there is shown a method of forming self-aligned and borderless interconnects, specifically, contacts and vias, borderless interconnects, specifically, contacts and vias, using a dual damascene interconnect process. The dual damascene process as disclosed here utilizes two etch-stop layers.

The disclosed process is used on a semiconductor substrate (110) provided with a substructure of devices formed in the substrate and/or metal layers thereof, and as they are not significant to the invention, they are not described in detail in order not to unnecessarily obscure the present invention. It will be understood by those skilled in the art that contacts are formed in an insulating layer in which the contacts provide connections between a source-drain, salicide or polysilicon to a metal layer, while vias are formed within upper dielectric layers providing connection between metal layers. The present invention is especially suitable for forming contact and via interconnects together and simultaneously.

In FIG. 3a, a first dielectric layer (120), is formed over substrate (110) provided with a substructure of devices and metal layers. Dielectric layer (120) may be formed from silicon oxide materials through methods including but not limited do CVD, PECVD, PVD sputtering methods. For the preferred embodiment of the present invention, dielectric layer (120) comprises $SiO_2$ having a thickness between about 500 to 5000 angstroms (Å). Next, an etch-stop layer (130) is deposited, preferably, silicon nitride $Si_3N_4$, having a thickness between about 100 to 1000 Å. Silicon nitride is formed by reacting dichlorosilane ($SiCl_2H_2$) with ammonia ($NH_3$) in an LPCVD at a pressure between about 0.5 to 0.6 Pa, temperature between about 700 to 850° C. and at flow rates between about 0.04 to 0.3 standard cubic centimeters per minute (sccm).

After the forming of the first dielectric layer and the first etch-stop layer, and as a main feature of this invention, a second dielectric layer (140) also comprising $SiO_2$ is formed over the first etch-stop layer having a thickness between about 500 to 5000 Å. Continuing with the main feature of the present invention, a second etch-stop layer (150) is formed over the second dielectric layer using the same recipe as in forming the first etch-stop layer and same thickness.

Next, first photoresist layer (160) is formed over second etch-stop layer (150) to a thickness between about 0.3 to 2.0 micrometers ($\mu$m) as shown in FIG. 3b. The first photoresist layer is preferably patterned with a mask having both patterns of contacts and vias. It will be appreciated that the photoresist can also be patterned separately with a first mask having contact hole pattern and a second mask having via hole pattern. Contact hole patterns are disposed over the corresponding substructure of the substrate including device areas, while via hole patterns are disposed over that corresponding substructure having metal lines. Thus, contact holes will be formed extending to the semiconductor surface where contact will be made with the devices thereon, while the via holes will be formed extending to the metal layer having metal lines. This is shown in a top view in FIG. 3c where (161), (163) depict via and contact hole patterns, respectively, while (167) refers to a metal line. Another aspect of this invention is also shown in FIG. 3c where the contact/via mask can be larger than the contact dimension of silicon/dimension of metal line by an amount (a) and/or (b) in the borderless direction, that is mask tolerances can be larger on account of borderless contacts/vias.

The contact/via pattern, (165), in the first photoresist layer shown in FIG. 3d, is next etched into nitride layer (150). Then, the first photoresist layer is removed by oxygen plasma ashing and second photoresist layer (170) is formed over second etch-stop layer (150) including the contact/via opening as shown in FIG. 3e. The preferred thickness of second photoresist layer is between about 0.8 to 1.2 $\mu$m. The second photoresist layer is patterned using a mask having metal line trench pattern.

Figure 3L:
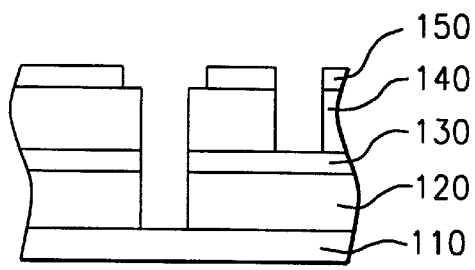
FIG. 3l shows the removal of the second photoresist layer from the substrate of this invention.

Next, line trench opening (175) shown in FIG. 3f is formed in second dielectric layer (140) extending to the first etch-stop layer (130) by using a recipe comprising $CF_4$, $CHF_3$ and Ar. This is shown in FIG. 3h while FIG. 3g shows a top view. It will be noted that pattern (175') cannot be etched through the second-etch-stop layer because of the high selectivity to silicon nitride of the etchant as seen in FIG. 3h. Both the first and second etch-stop layers, (130) and (150), respectively, are subsequently etched through openings (175) and (175'), as shown in FIG. 3i, by changing the etch recipe with a high selectivity to oxide and comprising $SF_6$ and He. Alternatively, $CHF_3$, $CF_4$ and Ar may also be used. Openings (175) and (175') are now etched into first and second dielectric layers, (120) and (140), respectively, as shown in FIG. 3j, by using again the etch recipe comprising $CHF_3$, $CF_4$ and Ar. It will be noted that opening (175) now contacts the substrate substructure having devices, while openings (175') form an interconnect with a higher level of substructure containing metal lines. Thus, borderless contact holes (175) and via holes (175') are formed as shown in FIG. 3k. Second photoresist layer (170) is next removed as shown in FIG. 3l and the resulting dual damascene structure is filled with metal (180), preferably copper, as shown in FIG. 3m.

It will be understood by those skilled in the art that CVD tungsten can also be used.

As a final step, chemical mechanical polishing is performed in order to remove excess metal and planarize the substrate surface encompassing the metal filled patterns and form the composite contact/via interconnections (185/185') shown in FIG. 3n. A top view is also shown in FIG. 3p.

While the invention has been particularly shown and described with reference to the preferred embodiments thereof, it will be understood by those skilled in the art that various changes in form and details may be made without departing from the spirit and scope of the invention.

What is claimed is:

1. A method of forming a self-aligned, borderless contact utilizing a dual damascene process having two etch-stop layers comprising the steps of:

providing a semiconductor substrate having a substructure further comprising a semiconductor device within said substrate and an interconnect metal line formed on said substrate;

forming a first dielectric layer over said substrate;

forming a first etch-stop layer over said first dielectric layer;

forming a second dielectric layer over said first etch-stop layer;

forming a second etch-stop layer over said second dielectric layer;

forming a first photoresist layer over said second etch-stop layer;

patterning said first photoresist layer with contact and via (contact/via) hole pattern;

etching through said contact/via hole pattern in said first photoresist layer and forming contact/via hole opening in said second etch-stop layer wherein said contact hole pattern is disposed over said device in said substructure and said via hole pattern is disposed over said metal line in said substrate;

removing said first photoresist layer from said substrate;

forming a second photoresist layer over said substrate including said contact/via hole opening;

patterning said second photoresist layer with a metal line trench pattern;

etching through said line trench pattern in said second photoresist layer into underlying said substrate until etch-stop layers, including said first and second etch-stop layers, are reached;

etching said line trench pattern into said first and second etch-stop layers forming said line trench opening into said first and second etch-stop layers;

etching further said line trench pattern into underlying substrate including said first and second dielectric layers until reaching said substructure, thus completing the forming of said self-aligned borderless contact;

removing said second photoresist layer;

forming metal in said contact/via opening in said first and second dielectric layers; and removing excess of said metal from the surface of said substrate in preparation for subsequent steps to complete the fabrication of a semiconductor substrate utilizing said dual damascene process.

2. The method of claim 1, wherein said first dielectric layer comprises $SiO_2$.

3. The method of claim 2, wherein said first dielectric is formed by PVD sputtering.

4. The method of claim 1, wherein said first dielectric layer has a thickness between about 500 to 5000 Å.

5. The method of claim 1, wherein said forming a first etch-stop layer over said first dielectric layer is accomplished by reacting dichlorosilane ($SiCl_2H_2$) with ammonia ($NH_3$) in an LPCVD at a pressure between about 0.5 to 0.6 Pa, temperature between about 700 to 800° C.

6. The method of claim 1, wherein said second dielectric layer comprises $SiO_2$.

7. The method of claim 6, wherein said second dielectric is formed by PVD sputtering.

8. The method of claim 1, wherein said second dielectric layer has a thickness between about 500 to 5000 Å.

9. The method of claim 1, wherein said forming a second etch-stop layer over said second dielectric layer is accomplished by reacting dichlorosilane ($SiCl_2H_2$) with ammonia ($NH_3$) in an LPCVD at a pressure between about 0.5 to 0.6 Pa, temperature between about 350 to 800° C.

10. The method of claim 1, wherein said first photoresist layer over said second etch-stop layer has a thickness between about 0.01 to 1.0 micrometers ($\mu m$).

11. The method of claim 1, wherein said patterning said first photoresist layer is accomplished with a mask having said contact/via hole pattern.

12. The method of claim 1, wherein said etching through said contact/via hole pattern in said first photoresist layer into said second etch-stop layer is accomplished with a recipe comprising $SF_6$ and He.

13. The method of claim 1, wherein said etching through said contact/via hole pattern in said first photoresist layer into said second etch-stop layer is accomplished with a recipe comprising $CHF_3$, $CF_4$ and Ar.

14. The method of claim 1, wherein said removal of said first photoresist layer is accomplished with oxygen plasma ashing.

15. The method of claim 1, wherein said second photoresist layer over said substrate including said contact/via hole opening has a thickness between about 0.5 to 1.2 $\mu m$.

16. The method of claim 1, wherein said patterning said second photoresist layer is accomplished with a mask having said metal line trench pattern.

17. The method of claim 1, wherein said etching through said line trench pattern in said second photoresist layer into underlying said substrate until an etch-stop layer, including said first and second etch-stop layers, is reached is accomplished with an etch recipe comprising $CHF_3$, $CF_4$ and Ar.

18. The method of claim 1, etching said line trench pattern into said first and second etch-stop layers forming said line trench openings into said first and second etch-stop layers is accomplished with a recipe comprising $SF_6$ and He.

19. The method of claim 1, etching said line trench pattern into said first and second etch-stop layers forming said line trench openings into said first and second etch-stop layers is accomplished with a recipe comprising $CHF_3$, $CF_4$ and Ar.

20. The method of claim 1, wherein said etching further said line trench pattern into underlying substrate including said first and second dielectric layers until reaching said substructure having said devices and said metal lines is accomplished with an etch recipe comprising $CHF_3$, $CF_4$ and Ar.

21. The method of claim 1, wherein said removing said second photoresist layer is accomplished by oxygen plasma ashing.

22. The method of claim 1, wherein said forming metal in said contact/via opening in said first and second dielectric layers is accomplished by depositing copper.

23. The method of claim 1, wherein said removing said excess of said metal from the surface of said substrate is accomplished by chemical mechanical polishing.

* * * * *